United States Patent
Lee

(10) Patent No.: US 11,480,664 B2
(45) Date of Patent: Oct. 25, 2022

(54) OPTICAL DETECTION DEVICE OF DETECTING A DISTANCE RELATIVE TO A TARGET OBJECT

(71) Applicant: PixArt Imaging Inc., Hsin-Chu (TW)

(72) Inventor: Sai Mun Lee, Penang (MY)

(73) Assignee: PixArt Imaging Inc., Hsin-Chu (TW)

( * ) Notice: Subject to any disclaimer, the term of this patent is extended or adjusted under 35 U.S.C. 154(b) by 812 days.

(21) Appl. No.: 16/431,742

(22) Filed: Jun. 5, 2019

(65) Prior Publication Data

US 2020/0386871 A1 Dec. 10, 2020

(51) Int. Cl.
| | |
|---|---|
| G01S 7/4861 | (2020.01) |
| G06T 7/246 | (2017.01) |
| G06T 7/13 | (2017.01) |
| G01S 17/08 | (2006.01) |
| G03F 7/20 | (2006.01) |
| G01C 15/00 | (2006.01) |
| G06T 7/529 | (2017.01) |
| G06T 7/571 | (2017.01) |
| G01N 15/14 | (2006.01) |
| G06V 30/146 | (2022.01) |

(52) U.S. Cl.
CPC .......... *G01S 7/4861* (2013.01); *G01C 15/002* (2013.01); *G01S 17/08* (2013.01); *G03F 7/70641* (2013.01); *G06T 7/13* (2017.01); *G06T 7/248* (2017.01); *G06T 7/529* (2017.01); *G06T 7/571* (2017.01); *G01N 2015/1452* (2013.01); *G06T 2207/10148* (2013.01); *G06T 2207/20* (2013.01); *G06V 30/1468* (2022.01)

(58) Field of Classification Search
None
See application file for complete search history.

(56) References Cited

U.S. PATENT DOCUMENTS

| | | | |
|---|---|---|---|
| 9,268,409 B2* | 2/2016 | Huang | G06F 3/017 |
| 10,254,855 B2* | 4/2019 | Lee | G06F 3/0317 |
| 2005/0109959 A1* | 5/2005 | Wasserman | H04N 5/2256 |
| | | | 250/559.19 |
| 2006/0029284 A1* | 2/2006 | Stewart | G02B 7/365 |
| | | | 348/E5.045 |
| 2007/0146325 A1* | 6/2007 | Poston | G06F 3/038 |
| | | | 345/163 |
| 2014/0062961 A1* | 3/2014 | Kao | G06F 3/04184 |
| | | | 345/175 |
| 2015/0339506 A1* | 11/2015 | Chen | G06K 7/10801 |
| | | | 235/462.21 |
| 2016/0357002 A1* | 12/2016 | Suzuki | G02B 21/244 |
| 2017/0160130 A1* | 6/2017 | Morino | G01J 3/10 |
| 2019/0293419 A1* | 9/2019 | Lee | G01C 3/08 |
| 2022/0180499 A1* | 6/2022 | Akopyan | G06T 7/0004 |

* cited by examiner

*Primary Examiner* — Tyler W. Sullivan
(74) *Attorney, Agent, or Firm* — Winston Hsu

(57) ABSTRACT

An optical detection device of detecting a distance relative to a target object includes a substrate, an optical sensor and a processor. The optical sensor is disposed on the substrate and adapted to capture an image about the target object. The processor is disposed on the substrate and electrically connected with the optical sensor. The processor is adapted to mark a first region and a second region within the image for acquiring first quantity of the first region and second quantity of the second region, and compare the first quantity with the second quantity for determining whether the distance is varied to a predefined condition.

18 Claims, 4 Drawing Sheets

OPTICAL DETECTION DEVICE OF DETECTING A DISTANCE RELATIVE TO A TARGET OBJECT

BACKGROUND OF THE INVENTION

1. Field of the Invention

The present invention relates to an optical detection device, and more particularly, to an optical detection device capable of detecting a distance relative to a target object for deciding when to actuate and stop tracking.

2. Description of the Prior Art

An optical navigation device captures and analyzes an image about a working surface where the optical navigation device is moved on, so as to acquire navigation information via displacement detection. When the conventional optical navigation device is lifted and moved above the working surface, the conventional optical navigation device generally utilizes a distance detector to compute a lifting height from the working surface, and the distance detector can be a laser detector, an infrared detector, a sonar detector and so on. Another conventional optical navigation device recognizes the drop in overall image quality or a change in image statistics when being lifted. A processor of the conventional optical navigation device has to compute data from the optical navigation detector and the height distance detector, and cannot avoid false triggers that impacts normal mouse usage experience because a lift height detection is larger than one millimeter, therefore the conventional optical navigation device provides low operation efficiency and expensive hardware cost.

SUMMARY OF THE INVENTION

The present invention provides an optical detection device capable of detecting a distance relative to a target object for deciding when to actuate and stop tracking for solving above drawbacks.

According to the claimed invention, an optical detection device of detecting a distance relative to a target object includes a substrate, an optical sensor and a processor. The optical sensor is disposed on the substrate and adapted to capture an image about the target object. The processor is disposed on the substrate and electrically connected with the optical sensor. The processor is adapted to mark a first region and a second region within the image for acquiring first quantity of the first region and second quantity of the second region, and compare the first quantity with the second quantity for determining whether the distance is varied to a predefined condition.

According to the claimed invention, the processor analyzes a comparison result between the first quantity and the second quantity via a predetermined algorithm. The optical detection device further includes a light source disposed on the substrate and adapted to illuminate the target object, and a memory electrically connected with the processor and adapted to store an experimental table about the first quantity and the second quantity. The first quantity is acquired by all pixels within the first region, or by pixels about an edge of the first region. A size combination of the first region and the second region is equal to or smaller than a size of the image.

According to the claimed invention, sizes of the first region and the second region are variable in accordance with change of the distance. The first region is consisted of some pixels having pixel values smaller than or equal to a predefined value, and the second region is consisted of other pixels having pixel values greater than the predefined value. The pixels of the first region are adjacent to each other and located inside a predefined contour, and the pixels of the second region are adjacent to each other and located inside another predefined contour.

According to the claimed invention, the processor determines the distance is varied to the predefined condition when a ratio of the second quantity to the first quantity is greater than a predefined threshold, and further determines the distance is not varied to the predefined condition when the ratio is smaller than or equal to the predefined threshold. The first quantity and the second quantity respective are sizes of the first region and the second region, and the predefined threshold is a size threshold.

According to the claimed invention, sizes of the first region and the second region are invariable when the distance is changed. The processor determines the distance is varied to the predefined condition when difference between the first quantity and the second quantity is greater than a predefined threshold, and further determines the distance is not varied to the predefined condition when the difference is smaller than or equal to the predefined threshold.

According to the claimed invention, the processor is adapted to analyze an edge of at least one of the first region and the second region, and determine material of the target object by comparing definition of the edge with a predefined threshold.

The optical detection device of the present invention can be used as the optical distance detector, the proximity sensor or the optical finger detector. The image captured by the optical sensor can be divided into at least two regions, and the at least two regions may have similar or dissimilar sizes. One of the regions is set in position distant from the light source and the other region is set in position nearby the light source. The at least two regions may be not arranged side by side to be in the same position relative to the light source. At least one of the size, the sharpness, the contrast and the intensity between the plural regions can be compared for determining a lifting height of the optical detection device. The optical detection device of the present invention can analyze a small amount of information about the captured image, so as to decrease the amount of information and increase operation speed effectively, and can accurately determine whether the optical detection device is lifted over the predefined height for stopping tracking and providing preferred usage experience.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
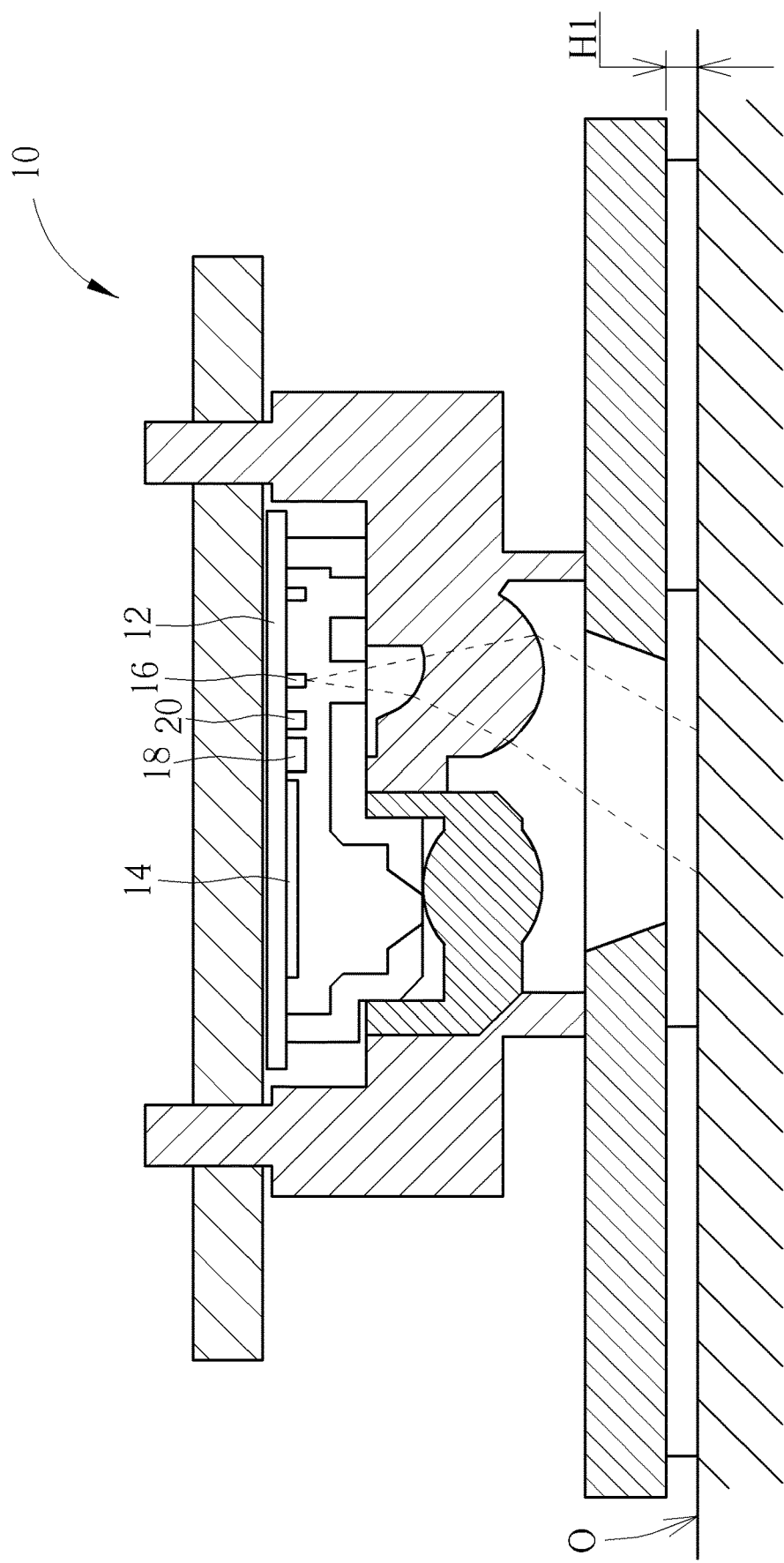
FIG. 1 and FIG. 2 are diagrams of an optical detection device in different operation modes according to an embodiment of the present invention.
Figure 2:
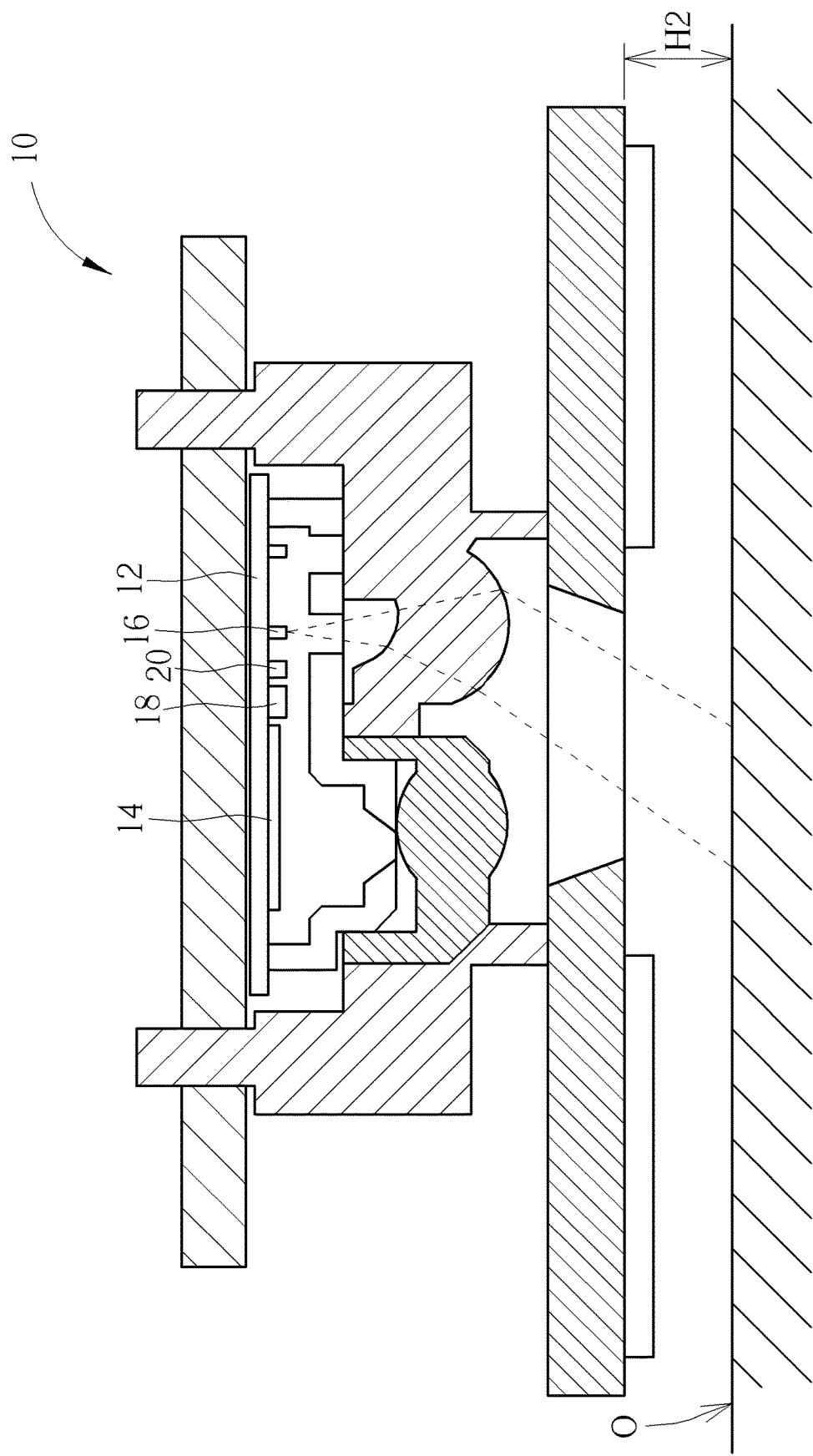

Please refer to FIG. 1 and FIG. 2. FIG. 1 and FIG. 2 are diagrams of an optical detection device 10 in different operation modes according to an embodiment of the present invention. The optical detection device 10 can provide a function of detecting a distance of the optical detection device 10 relative to a target object O. In one embodiment, the optical detection device 10 can be an optical mouse, and the target object O is a working surface, such as the mouse pad. The optical detection device 10 can continuously output tracking information when the distance is near a height H1; when the distance is detected as greater than a height H2, the optical detection device 10 can be lifted to stop outputting the tracking information. In other embodiment, the optical detection device 10 may be a proximity sensing module, and thus the target object O can be a user's finger or a user's face.

Figure 3:
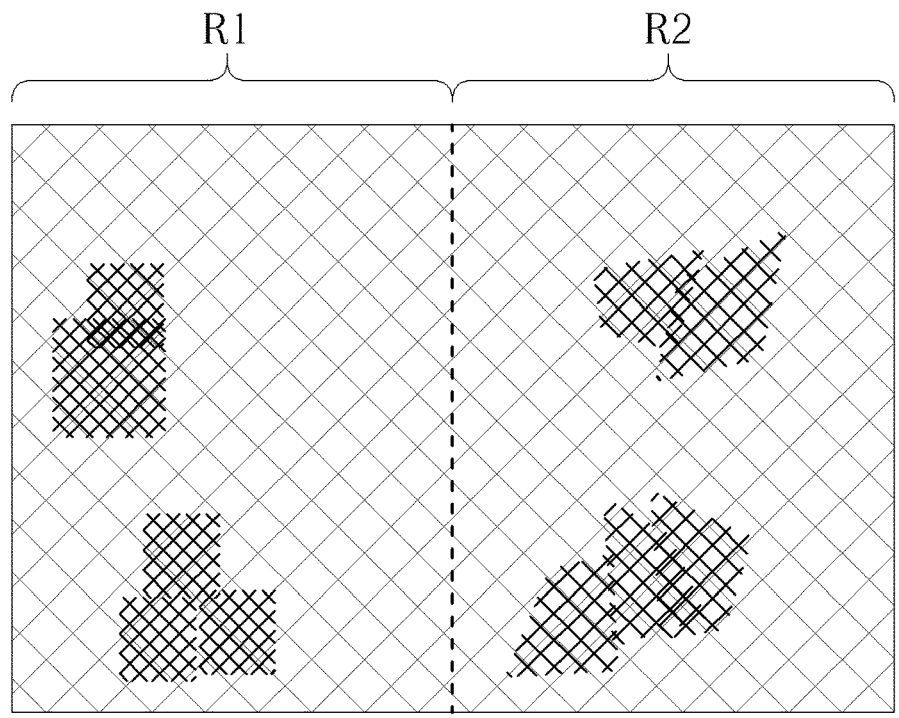
FIG. 3 and FIG. 4 are diagrams of an image captured by the optical detection device in different operation modes according to a first embodiment of the present invention.
Figure 4:
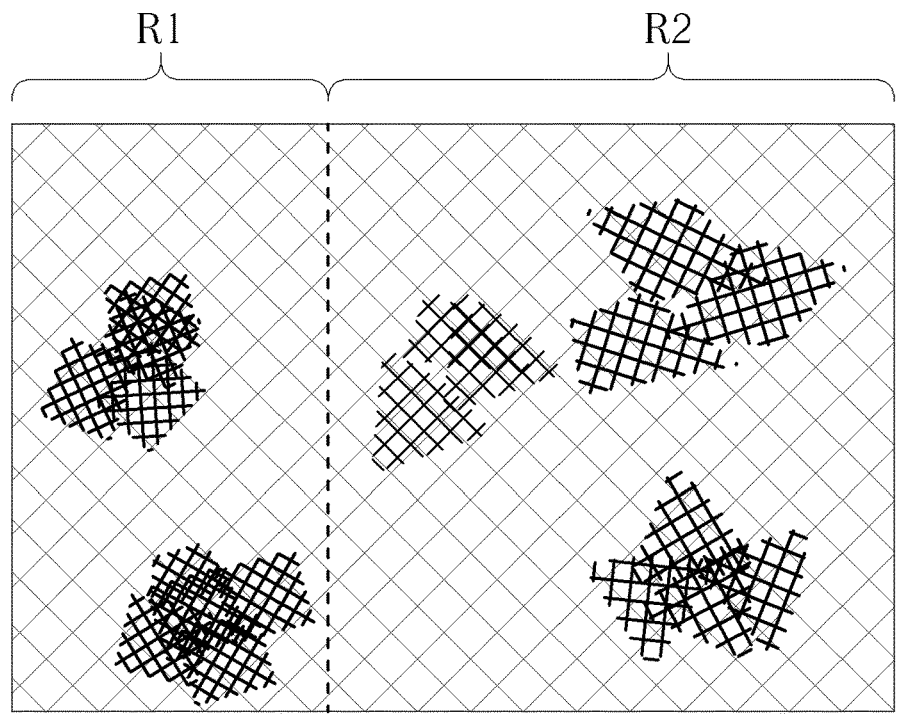
Figure 5:
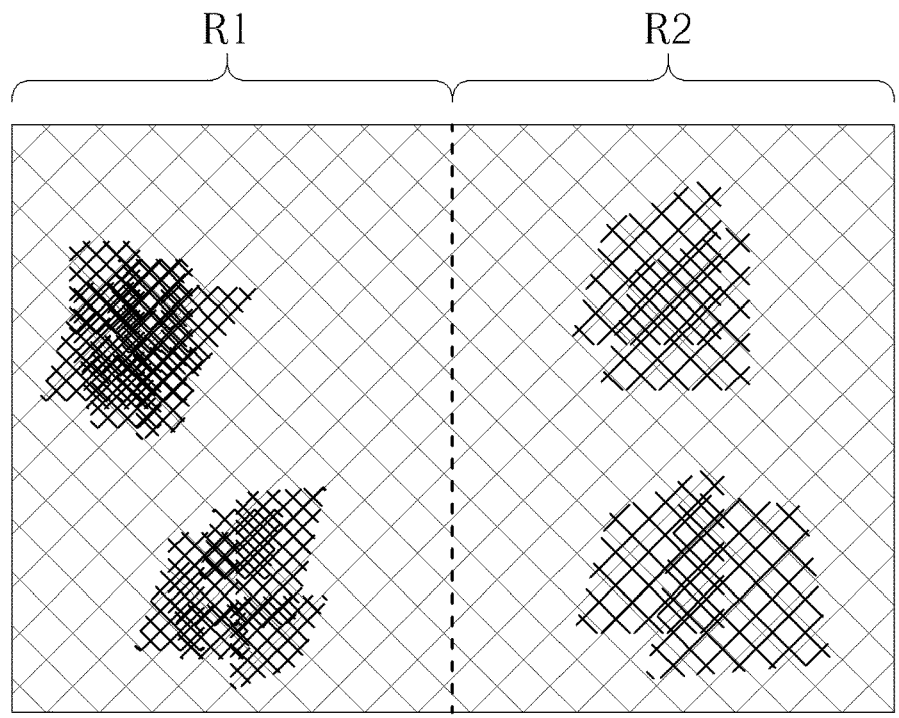
FIG. 5 and FIG. 6 are diagrams of the image captured by the optical detection device in different operation modes according to a second embodiment of the present invention.
Figure 6:
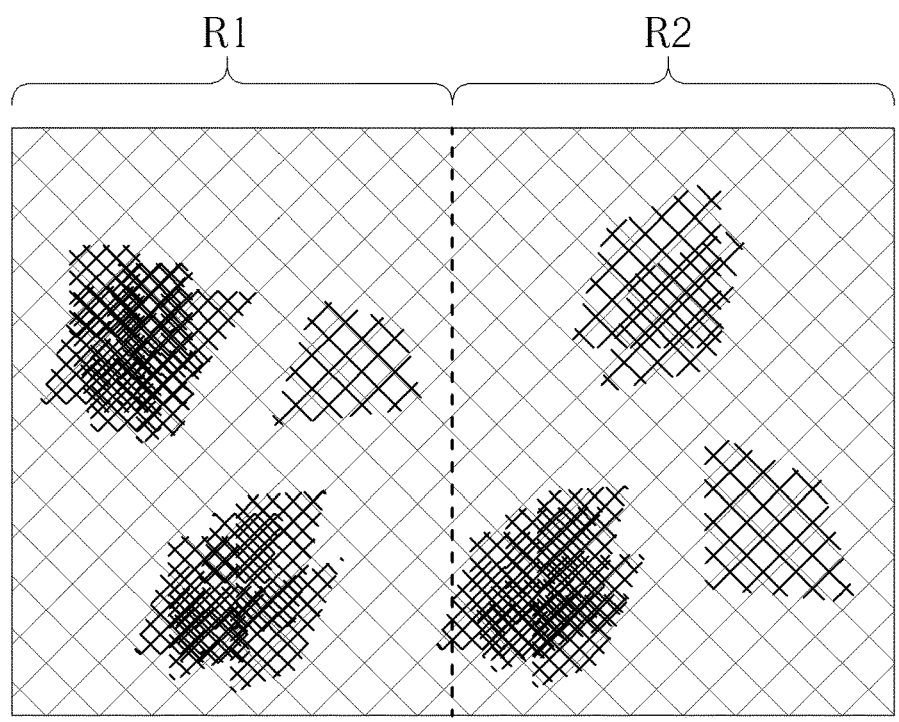

Please refer to FIG. 3 to FIG. 6. FIG. 3 and FIG. 4 are diagrams of an image I captured by the optical detection device 10 in different operation modes according to a first embodiment of the present invention. FIG. 5 and FIG. 6 are diagrams of the image I captured by the optical detection device 10 in different operation modes according to a second embodiment of the present invention. The optical detection device 10 can include a substrate 12, an optical sensor 14, a light source 16, a memory 18 and a processor 20. The light source 16 and the memory 18 are optional units. The optical sensor 14, the light source 16, the memory 18 and the processor 20 can be disposed on the substrate 12 and electrically connected with each other. The light source 16 can illuminate the target object O if ambient illumination is insufficient. The optical sensor 14 can capture the image I about the target object O with or without illumination of the light source 16.

The processor 20 can mark a first region R1 and a second region R2 within the image I for acquiring first quantity of the first region R1 and second quantity of the second region R2. Then, the optical detection device 10 can determine whether the distance is varied to a predefined condition via a comparison between the first quantity and the second quantity. The predefined condition means a specific lifting height, such like the height H2. As shown in FIG. 1, the optical detection device 10 is put on the working surface, so the distance between the optical detection device 10 and the target object O may be near the height H1. As shown in FIG. 2, the optical detection device 10 is suspended above the working surface, and the distance can be determined as varied to the predefined condition when the optical detection device 10 is lifted to the height H2. The first quantity and the second quantity are varied in response to the optical detection device 10 being lifted or lowered. The processor 20 analyzes the quantity comparison to keep or stop outputting the tracking information.

Sizes of the first region R1 and the second region R2 can be variable or invariable in accordance with definition of the two regions; accordingly, analysis of the first quantity and the second quantity can be executed by a predetermined algorithm or an experimental table in response to the definition of the regions. The predetermined algorithm and the experimental table can be stored in the memory 18. The first quantity and the second quantity can be acquired by all pixels within the first region R1 and the second region R2; for example, pixel values of the whole pixels within the first region R1 can be used to compute the first quantity. Besides, an edge of the first region R1 or the second region R2 may have distinct change when the optical detection device 10 is lifted, so that the first quantity and the second quantity can be optionally acquired by pixels about edges of the first region R1 and the second region R2.

For a start, the first region R1 and the second region R2 can be marked by uniformly dividing the image I, which means the sizes of the first region R1 and the second region R2 are identical, and a size combination of the first region R1 and the second region R2 is equal to a size of the image I; generally, the image I are uniformly divided to mark the first region R1 and the second region R2 as initialized reference when the optical detection device 10 is close to the target object O and has the height H1. Moreover, the first region R1 and the second region R2 may be marked as small regions inside the image I, which means the sizes of the first region R1 and the second region R2 are identical, and the size combination of the first region R1 and the second region R2 is smaller than the size of the image I. In a possible situation, the sizes of the first region R1 and the second region R2 may be dissimilar but size relation between the first region R1 and the second region R2 are known for computation.

In the first embodiment, the sizes of the first region R1 and the second region R2 are variable in accordance with change of the distance. The first region R1 utilizes dense lines drawn at a slant to represent a dark region because the first region R1 is distant from the light source 16. The second region R2 utilizes sparse lines drawn at the slant to represent a bright region because the second region R2 is close to the light source 16. The dark region may be interpreted as the first region R1 consisted of some pixels having pixel values smaller than or equal to a predefined value, and the bright region may be interpreted as the second region R2 consisted of other pixels having pixel values greater than the predefined value. The predefined value can be set according to an efficiency of the light source 16 and/or the ambient illumination of the optical detection device 10, and a detailed description is omitted herein for simplicity.

As shown in FIG. 1 and FIG. 3, the size of the first region R1 may be identical with the size of the second region R2. The optical detection device 10 putting on the target object O can result in the distance similar to the height H1, and a size ratio of the second region R2 to the first region R1 is known as an initial value in accordance with structural design of the optical detection device 10, such as parameters about an imaging chancel of the optical sensor 14 and an illuminating channel of the light source 16. The size ratio of the first region R1 to the second region R2 can be gradually varied when the optical detection device 10 is lifted. A predefined threshold can be set as a size threshold; when the size ratio is smaller than or equal to the predefined threshold, the distance is not varied to the predefined condition, which means the optical detection device 10 may be lifted to a position under the height H2. When the size ratio is greater than the predefined threshold, the optical detection device 10 is determined as lifting over the height H2, as shown in FIG. 2 and FIG. 4.

That is to say, the first quantity can be the size of the first region R1, and the second quantity can be the size of the second region R2. A boundary between the first region R1 and the second region R2 may be blurred, so the present invention can define the pixels not only having intensity values smaller than or equal to the predefined value but also being adjacent to each other and located inside a predefined contour are gathered as the first region R1, and further define the pixels not only having the intensity values greater than the predefined value but also being adjacent to each other and located inside another predefined contour are gathered as the second region R2. Thus, the first region R1 and the second region R2 can be defined as two independent regions which are not overlapped inside the image I.

In the second embodiment, the sizes of the first region R1 and the second region R2 are invariable when the distance is changed. The first quantity can be selected from a group consisting of sharpness, contrast, intensity, and a combination thereof about the first region R1. Accordingly, the second quantity can be selected from a group consisting of sharpness, contrast, intensity, and a combination thereof about the second region R2. The predefined threshold can be set as a sharpness threshold, a contrast threshold or an intensity threshold. Property of the first quantity, the second quantity and the predefined threshold are not limited to the above-mentioned embodiment, which depend on design demand.

When difference between the first quantity and the second quantity is smaller than or equal to the predefined threshold, the first region R1 and the second region R2 can be represented as being similar to each other, which may indicate the illumination from the light source 16 is generally uniform across a viewable area of the optical sensor 14; the distance is determined as not varying to the predefined condition, the optical detection device 10 is in a position below the height H2, as shown in FIG. 1 and FIG. 5. When the difference between the first quantity and the second quantity is greater than the predefined threshold, the first region R1 and the second region R2 can be different from each other, which means the illumination from the light source 16 may be not well centered in the viewable area of the optical sensor 14; thus, the distance is determined as varying to the predefined condition, the optical detection device 10 is in the height H2 or more above.

If the two regions R1 and R2 and the image I are overlapped (for example, the image I is divided into the first region R1 and the second region R2, or the first region R1 and the second region R2 are marked on a border of the image I), the optical detection device 10 can analyze an edge of at least one of the first region R1 and the second region R2 to determine material of the target object O. A predefined threshold can be set according to resolution of the optical sensor 14, which depends on actual demand. When the edge of the first region R1 and/or the second region R2 has definition greater than the predefined threshold, the target object O may provide high reflectivity and can be determined as photographic paper or a glossy mouse pad. In this condition, the predefined threshold may be an index of reflection. When the edge of the first region R1 and/or the second region R2 has the definition equal to or smaller than the predefined threshold, the target object O may provide low reflectivity and can be determined as textile or a dull mouse pad.

In conclusion, the optical detection device of the present invention can be used as the optical distance detector, the proximity sensor or the optical finger detector. The image captured by the optical sensor can be divided into at least two regions, and the at least two regions may have similar or dissimilar sizes. One of the regions is set in position distant from the light source and the other region is set in position nearby the light source. The at least two regions may be not arranged side by side to be in the same position relative to the light source. At least one of the size, the sharpness, the contrast and the intensity between the plural regions can be compared for determining a lifting height of the optical detection device. The optical detection device of the present invention can analyze a small amount of information about the captured image, so as to decrease the amount of information and increase operation speed effectively, and can accurately determine whether the optical detection device is lifted over the predefined height for stopping tracking and providing preferred usage experience.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An optical detection device of detecting a distance relative to a target object, the optical detection device comprising:
   a substrate;
   an optical sensor disposed on the substrate and adapted to capture an image about the target object; and
   a processor disposed on the substrate and electrically connected with the optical sensor, the processor being adapted to mark a first region and a second region within the image for acquiring first quantity of the first region and second quantity of the second region, and compare the first quantity with the second quantity for determining whether the distance is varied to a predefined condition;
   wherein sizes of the first region and the second region are variable in accordance with change of the distance.

2. The optical detection device of claim 1, further comprising:
   a light source disposed on the substrate and adapted to illuminate the target object.

3. The optical detection device of claim 1, wherein the processor analyzes a comparison result between the first quantity and the second quantity via a predetermined algorithm.

4. The optical detection device of claim 1, further comprising:
   a memory electrically connected with the processor and adapted to store an experimental table about the first quantity and the second quantity.

5. The optical detection device of claim 1, wherein the first quantity is acquired by all pixels within the first region, or by pixels about an edge of the first region.

6. The optical detection device of claim 1, wherein a size combination of the first region and the second region is equal to or smaller than a size of the image.

7. The optical detection device of claim 1,
   wherein the first region is consisted of some pixels having pixel values smaller than or equal to a predefined value, and the second region is consisted of other pixels having pixel values greater than the predefined value.

8. The optical detection device of claim 7, wherein the pixels of the first region are adjacent to each other and located inside a predefined contour, and the pixels of the second region are adjacent to each other and located inside another predefined contour.

9. The optical detection device of claim 1, wherein sizes of the first region and the second region are invariable when the distance is changed.

10. The optical detection device of claim 1, wherein the processor determines the distance is varied to the predefined condition when a ratio of the second quantity to the first quantity is greater than a predefined threshold, and further determines the distance is not varied to the predefined condition when the ratio is smaller than or equal to the predefined threshold.

11. The optical detection device of claim 10, wherein the first quantity and the second quantity respective are sizes of the first region and the second region, and the predefined threshold is a size threshold.

12. The optical detection device of claim 1, wherein the processor determines the distance is varied to the predefined condition when difference between the first quantity and the second quantity is greater than a predefined threshold, and further determines the distance is not varied to the predefined condition when the difference is smaller than or equal to the predefined threshold.

13. The optical detection device of claim 12, wherein the first quantity and the second quantity respectively are sharpness of the first region and the second region, and the predefined threshold is a sharpness threshold.

14. The optical detection device of claim 12, wherein the first quantity and the second quantity respectively are contrast of the first region and the second region, and the predefined threshold is a contrast threshold.

15. The optical detection device of claim 12, wherein the first quantity and the second quantity respectively are intensity of the first region and the second region, and the predefined threshold is an intensity threshold.

16. The optical detection device of claim 1, wherein the processor is adapted to analyze an edge of at least one of the first region and the second region, and determine material of the target object by comparing definition of the edge with a predefined threshold.

17. An optical detection device of detecting a distance relative to a target object, the optical detection device comprising:

a substrate;

an optical sensor disposed on the substrate and adapted to capture an image about the target object; and a processor disposed on the substrate and electrically connected with the optical sensor, the processor being adapted to mark a first region and a second region within the image for acquiring first quantity of the first region and second quantity of the second region, and compare the first quantity with the second quantity for determining whether the distance is varied to a predefined condition;

wherein the processor determines the distance is varied to the predefined condition when a ratio of the second quantity to the first quantity is greater than a predefined threshold, and further determines the distance is not varied to the predefined condition when the ratio is smaller than or equal to the predefined threshold.

18. The optical detection device of claim 17, wherein the first quantity and the second quantity respective are sizes of the first region and the second region, and the predefined threshold is a size threshold.

* * * * *